United States Patent
Kawanishi (10) Patent No.: US 6,360,349 B1
(45) Date of Patent: Mar. 19, 2002

(54) SYNDROME COMPUTING APPARATUS

(75) Inventor: Hiroyuki Kawanishi, Yokohama (JP)

(73) Assignee: Nippon Precision Circuits, Inc., Tokyo (JP)

( * ) Notice: Subject to any disclaimer, the term of this patent is extended or adjusted under 35 U.S.C. 154(b) by 0 days.

(21) Appl. No.: 09/083,761

(22) Filed: May 22, 1998

(30) Foreign Application Priority Data

May 26, 1997 (JP) .............................................. 9-135008

(51) Int. Cl.[7] .............................................. H03M 13/00
(52) U.S. Cl. ....................... 714/785; 714/781
(58) Field of Search ........................ 714/15, 785, 793, 714/755, 761, 758, 781

(56) References Cited

U.S. PATENT DOCUMENTS

| | | | | |
|---|---|---|---|---|
| 4,354,269 A | * | 10/1982 | Vries et al. .................. | 714/793 |
| 4,849,975 A | * | 7/1989 | Patel ........................... | 714/761 |
| 5,644,695 A | * | 7/1997 | Blaum et al. .................. | 714/6 |
| 5,872,799 A | * | 2/1999 | Lee et al. .................... | 714/755 |

FOREIGN PATENT DOCUMENTS

| | | |
|---|---|---|
| JP | 6-252874 | 9/1994 |
| JP | 7-074655 | 3/1995 |

* cited by examiner

*Primary Examiner*—Dieu-Minh Le
(74) *Attorney, Agent, or Firm*—Schulte Roth & Zabel LLP; Donna L. Angotti; Joel Lutzker (57) ABSTRACT

A syndrome computing apparatus includes first syndrome computing circuit 2, 4 for receiving a predetermined number of bits of data (codewords) encoded based on a predetermined generator polynomial and performing a syndrome computation on the data inputted based on the generator polynomial. Shift register 1 delays the data by the predetermined number of bits. Second syndrome computing circuit 3, 5 receives the data delayed by the predetermined number of bits, and performs a syndrome computation on the data inputted based on the generator polynomial. Operating circuit 7, 8 vector-adds modulo 2 a first syndrome outputted by said first syndrome computing means to a second syndrome outputted by said second syndrome computing means. Outputs of said operating means 6, 7 are offered as a syndrome based on the generator polynomial.

8 Claims, 8 Drawing Sheets

SYNDROME COMPUTING APPARATUS

BACKGROUND OF THE INVENTION

This invention relates to a syndrome computing apparatus used for error correcting apparatuses using cyclic codes.

At present, error correcting apparatuses with cyclic codes are utilized for communication devices, data memories, and so on. These error correcting apparatuses makes computation of syndromes on data (codewords) previously encoded by utilizing a generator polynominal. The error correcting apparatuses are adapted to detect data error positions by utilizing that all but "0" of the syndrome results from an error caused through a transmission line, which corresponds to an error position in a one-to-one manner.

The data as codewords used for computation is obtainable, through double error-correctable BCH (Bose-Chaudhuri-Hocquenghem) encoding, by expressing for example a generator polynominal G(x) using the following two polynomials g1(x) and g2(x).

$$g1(x)=x^5+x^2+1$$

$$g2(x)=x^5+x^4+x^3+x^2+1$$

where g1(x) is a primitive polynominal and g2(x) is a minimal polynominal having a solution $\alpha^3$ thereto provided that $\alpha$ is a solution to g1(x). These polynominals are given based on the elements of a Galois field GF($2^5-1$).

The below computation is a modulo-2 arithmetic that uses, as a factor, an element of Galois field GF(2).

Here, the generator polynominal G(x) is expressed as:

$$G(x)=g1(x)g2(x)=x^{10}+x^9+x^8+x^6+x^5+x^3+1.$$

As for the data, information bits ($i_{20}$, $i_{19}$, $i_{18}$, . . . , $i_0$) representative of 21-bit actual information is given by:

$$I(X)=i_{20}x^{30}+i_{19}x^{29}+i_{18}x^{28}+ \ldots +i_0x^{10}.$$

This equation is divided by the generator polynominal G(x) to obtain a residue ($p_9$, $p_8$, $p_7$, . . . , $p_0$). This residue is added as check bits to the information bits.

That is, if encoded data is given by W=($w_{30}$, $w_{29}$, $w_{28}$, . . . , $w_0$), the following relationship is obtained:

$$(w_{30}, w_{29}, w_{28}, \ldots, w_0)=(i_{20}, i_{19}, i_{18}, \ldots, i_0, p_9, p_8, p_7, \ldots, p_0)$$

This gives a residue 0 when it is divided by G(x).
This data can be expressed by a polynominal as:

$$W(X)=w_{30}x^{30}+w_{29}x^{29}+w_{28}x^{28}+ \ldots +w_0x^0$$

where W(X) has roots of $\alpha$ and $\alpha^3$. That is, those fallen onto W($\alpha$)=W($\alpha^3$)=0 are included in a set for this code.

From the above, those having W($\alpha$) and W($\alpha^3$) not fallen onto 0 will not constitute the above code, resulting in involving an error. This value is referred to as a syndrome (S). Data errors are specified of position and corrected by examining this value.

If the syndrome is vector-represented as S=($s_1$, $s_2$) ($s_1$ and $s_2$ are respectively correspond to $\alpha$ and $\alpha^3$ and the solution $\alpha^3$ of g2(x) is written by $\beta$, the syndrome can be determined by matrix operation as follows:

$$S=W \cdot H^T$$

where H is a check matrix expressed by $$H = \begin{bmatrix} \alpha^{30}, \alpha^{29}, \alpha^{28}, \ldots, \alpha^2, \alpha^1, \alpha^0 \\ \beta^{30}, \beta^{29}, \beta^{28}, \ldots, \beta^2, \beta^1, \beta^0 \end{bmatrix}$$

As stated above, it has been a conventional practice to compute a syndrome directly from the data inputted. However, where the data is unclear of position at which data begins, it is impossible to correctly compute a syndrome.

To this end, where collating for a frame synchronous pattern, etc. that is unclear of position data (codewords) begins, the data has to be collated over the entire portions thereof such that it is determined whether or not it resides within an error correctable range where the number of the error bits can be warranted by the code.

SUMMARY OF THE INVENTION

It is therefore the object of the invention to provide a syndrome computing means which is capable of computing a syndrome at every 1-bit input even where a codeword is unclear of position at which it begins, by computing a first syndrome on input data and simultaneously a second syndrome on the data with a delay by a number of bits due to previous fetch into a delay means, and vector-adding modulo 2 the first syndrome without delay to the second syndrome at every 1-bit input.

According to the present invention, a syndrome computing apparatus, comprises: a first syndrome computing means for receiving a predetermined number of bits of data (codewords) encoded based on a predetermined generator polynominal, and performing a syndrome computation on the data inputted based on the generator polynominal; a delay means for outputting the data with a delay by the predetermined number of bits; a second syndrome computing means for receiving the data delayed by the predetermined number of bits, and performing a syndrome computation on the data inputted based on the generator polynominal; and an operating means for vector-adding modulo 2 a first syndrome outputted by the first syndrome computing means to a second syndrome outputted by the second syndrome computing means, whereby an output of the operating means is offered as a syndrome based on the generator polynominal.

Preferably, the first and second syndrome computing means are formed by a combination of an exclusive-OR circuit and registers, the delay means being configured by a shift register with the predetermined number of the bits of the codewords, and the operating means is configured by an exclusive-OR circuit.

According to one form of the present invention, a syndrome computing apparatus, comprises: a plurality of first syndrome computing means for receiving a predetermined number of bits of data encoded based on a generator polynominal, and performing a syndrome computation on the inputted data by using an individually assigned polynominal among a plurality of polynominals constituting the generator polynominal; a delay means for outputting the data with a delay by the predetermined number of bits; a plurality of second syndrome computing means for receiving the data delayed by the predetermined number of bits from the delay means, and performing a syndrome computation on the inputted data by using an individually assigned polynominal among a plurality of polynominals constituting the generator polynominal; a plurality of operating means for vector-adding modulo 2, using the individually assigned polynominal among the plurality of polynominals constituting the generator polynominal, a first syndrome to a second syndrome which are respectively outputted by the first syndrome computing means, the second syndrome computing means corresponding to the individually assigned polynominal; whereby an output of the operating means is offered as a syndrome based on the generator polynominal.

PREFERRED EMBODIMENT OF THE INVENTION

The present invention will now be explained on a syndrome computing apparatus as one embodiment thereof. This embodiment is implemented by employing BCH encoding, as will be explained hereinbelow with reference to the drawings.

The data (codewords) of this example is assumably obtained by double error correctable BCH encoding using a generator polynominal G(x) expressed by two polynominals g1(x) and g2(x). That is, the data in actual is configured by a BCH(31, 21) code, which is formed by 21-bits of information bits to be transmitted as information and 10-bits of check bits added thereto.

Figure 1:
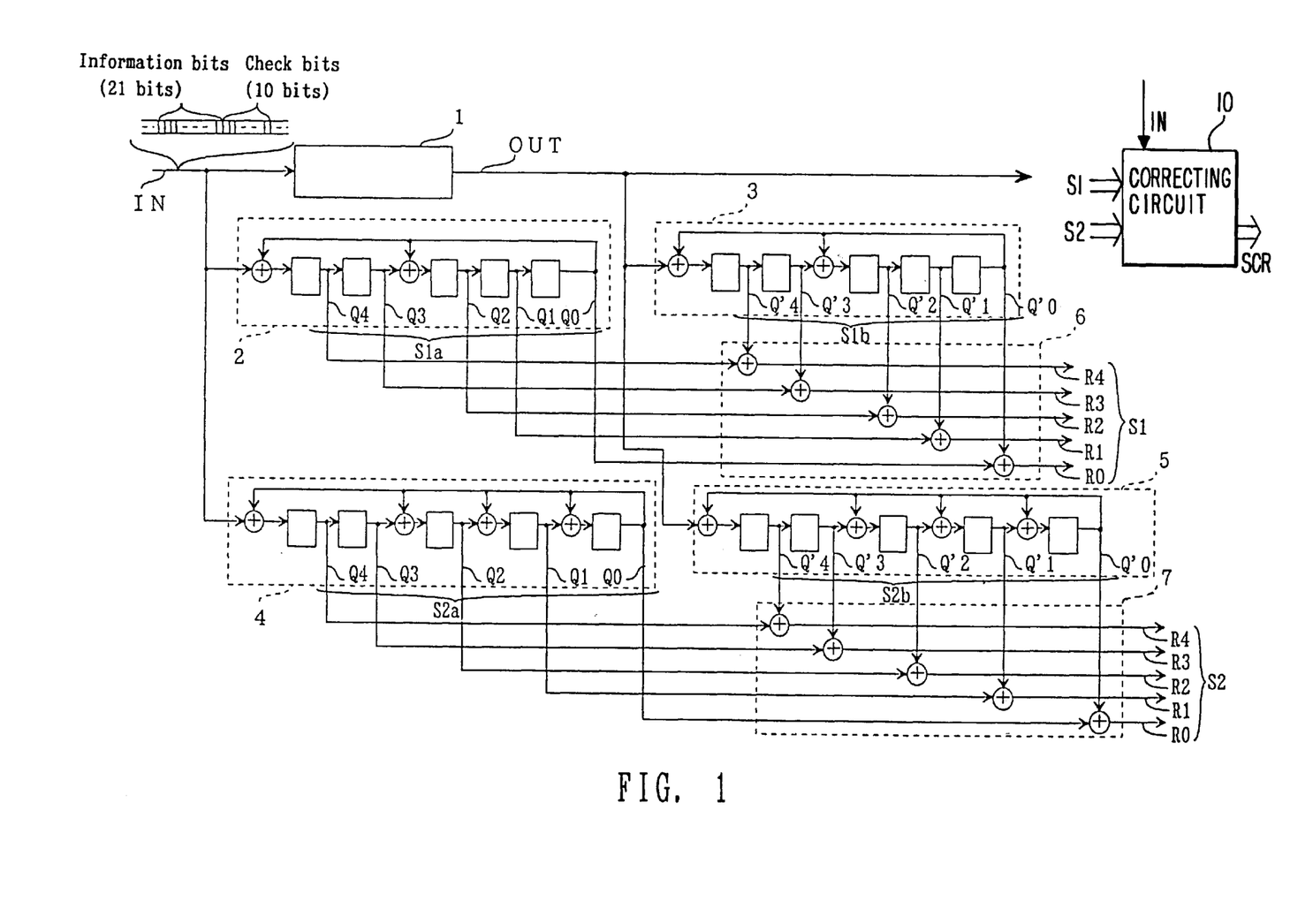
FIG. 1 is an explanatory diagram for explaining a structure of a syndrome computing apparatus according to one embodiment of the present invention.
Figure 2:
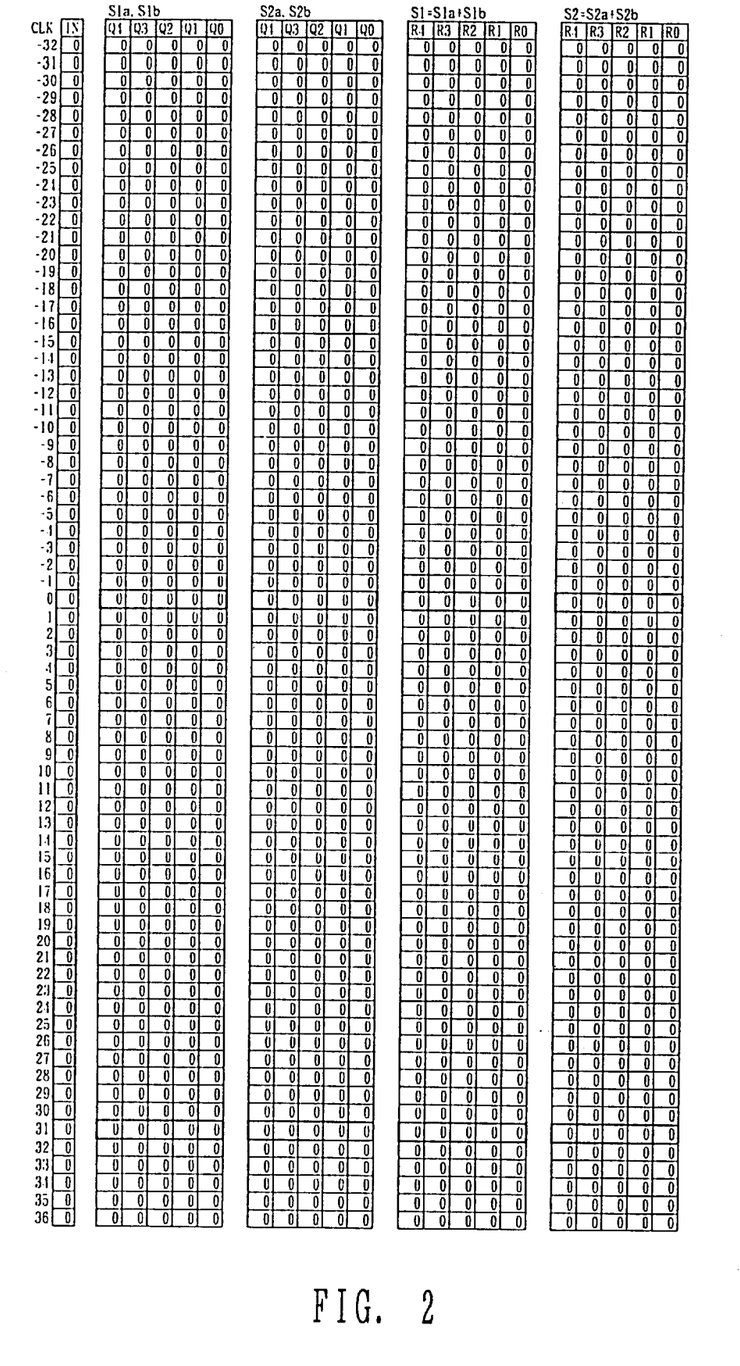
FIG. 2 is an explanatory diagram for explaining operation of the apparatus of FIG. 1.

Referring first to FIG. 1, there is shown a structure of a syndrome computing apparatus of the invention. In the figure, a shift register 1 as a delay means causes data encoded as stated above to delay by its data length. Here, the shift register 1 is inputted with data through an input terminal IN, and holds and outputs the data with 31-bit delay.

A first syndrome computing means 2 computes a syndrome corresponding to a solution α to the polynominal g1(x) (corresponding to $s_1$ stated above) from the data inputted through the input terminal IN. The first syndrome computing means 2 is formed by five registers and two exclusive-OR circuits, so as to output a 5-bit first syndrome S1a.

On the other hand, a second syndrome computing means 3 computes a syndrome corresponding to the solution to the polynominal g1(x) (corresponding to si stated above) from the data delayed by 31 bits by the shift register 1. The second syndrome computing means 3 is similarly formed to the one part of the first syndrome computing means 2, in order to output a second syndrome S1b.

The first syndrome computing means 4 computes a syndrome corresponding to a solution $\alpha^3$ to the polynominal g2(x) (corresponding to $s_2$ stated above) from the data inputted through the input terminal IN. The first syndrome computing means 4 is formed by five registers and four exclusive-OR circuits, to output a 5-bit first syndrome S2a.

Meanwhile, the second syndrome computing means 5 computes a syndrome corresponding to the solution $\alpha^3$ to the polynominal g2(x) (corresponding to $s_2$ stated above) from the data delayed by 31 bits by the shift register 1. The second syndrome computing means 5 is similarly formed to the other part of the first syndrome computing means 4, in order to output a second syndrome S2b. Note that the first syndrome computing means 2, 4 has their 5-bit outputs which are represented by common codes (Q4, Q3, Q2, Q1, Q0) for each bit while the second syndrome computing means 3, 5 has their 5-bit outputs represented by common codes (Q'4, Q'3, Q'2, Q'1, Q'0) for each bit.

Two arithmetic means 6, 7 have respective 5-bit exclusive OR circuits. The arithmetic means 6 makes modulo-2 addition on the first syndrome S1a to the second syndrome S1b on each-bit basis. The arithmetic means 7, on the other hand, makes modulo-2 addition on the first syndrome S2a to the second syndrome S2b on each-bit basis. Note that the arithmetic means 6, 7 have respective additional results which are denoted by common codes (R4, R3, R2, R1, R0) for each bit.

Now operations of this embodiment will be explained below.

First, the 31-bit shift register 1 and the registers of the syndrome computing circuits 2, 3, 4 and 5 are initialized at "0" by initial setting.

Thereafter, data configured by 31-bits is inputted, on a 1-bit basis, through IN to the shift register 1 and the first syndrome computing means 2, 4. At the same time, 31-bit data with delay is outputted by the shift register 1 and inputted to the second syndrome computing means 3, 5.

The first syndrome computing means 2 and the second syndrome computing means 3 respectively output a first syndrome S1a and a second syndrome S1b which are data configured by 5-bits and correspond to α. These first syndrome S1a and the second syndrome S1b are added modulo 2, on each-bit basis, by the operating means 6. Similarly, the first syndrome computing means 4 and the second syndrome computing means 5 respectively output a first syndrome S2a and a second syndrome S2b which are data configured by 5-bits and correspond to β. These first syndrome S2a and the second syndrome S2b are added modulo 2, on each-bit basis, by the operating means 7.

Using the first syndrome S1a without delay for the data corresponding α and the second syndrome S1b with delay for the data corresponding α, a syndrome S1 representative of an error state of the data during the delay is expressed as $$S1=S1b-S1a.$$

Here, subtraction is equivalent to addition because of modulo-2 calculation, and the above equation can be written as $$S1=S1b+S1a.$$

Similarly, using the first syndrome S2a without delay for the data corresponding β and the second syndrome S2b with delay for the data corresponding β, a syndrome S2 representative of an error state of the data during the delay is expressed as $$S2=S2b-S2a=S2b+S2a.$$

That is, the operating means 6, 7 respectively output a syndrome S1 corresponding to α and a syndrome S2 corresponding to β that are representative of the error state of the data during the delay. In this manner, the syndromes S1 and S2 are outputted as syndromes for the 31-bit codewords stored for delay in the shift register 1.

Thereafter, when next input bits are inputted through the in, terminal IN, the data is shifted by 1 bit so that syndromes S1 and S2 corresponding to the new codewords are outputted by way of processes similar to the above. In this manner, it is possible to produce a syndrome for the codewords involving the previously inputted 30-bit data, on 1-bit basis for the data successively inputted.

The syndrome thus produced is checked by an error correcting circuit, 10, to thereby determine whether there is no error in the data or not and whether the data, if it has an error, is possible to correct or not. Where correction is possible, the determination of the frame synchronizing code is also possible to perform on 1-bit basis for the data successively inputted. This operation was actually simulated as shown in FIG. 2 through FIG. 8.

These figures represents states on signal lines in a clock unit, wherein a column CLK denotes a time in a clock unit with an upward direction taken as past. A column IN denotes an IN signal, the data listed downward are successively inputted. The previous 31 data is held in the shift register 1 in FIG. 1.

A Next column S1$a$, S1$b$ represents the states of outputs (Q4, Q3, Q2, Q1, Q0) of the first syndrome output means 2 and the states of outputs (Q'4, Q'3, Q'2, Q'1, Q'0) of the second syndrome output means 3 that are corresponding to α. These output states are operated by a signal state at a previous stage.

A Next column S2$a$, S2$b$ represents the states of outputs (Q4, Q3, Q2, Q1, Q0) of the first syndrome output means 4 and the states of outputs (Q'4, Q'3, Q'2, Q'1, Q'0) of the second syndrome output means 5 that are corresponding to $\alpha^3$. These output states are also operated by a signal state at a previous stage.

Here, the above-stated two columns are in a relationship that the second syndrome computing means 3, 5 has an output value, at a certain time, equal to the value of an output of the first syndrome computing means 2, 4 at a time preceded by 31 clocks to the certain time. The columns S1, S2 represent the states of additional results (R4, R3, R2, R1, R0) of the outputs of the first and second syndromes, wherein operations have been made on the assumption that the state at −32-th clock and before is remained unchanged.

Here, if the current is assumed taken at a 31th clock, syndromes for the bold-framed data present at from 0-th clock to a 30-th clock in the IN column appear in the S1 and S2 columns. The bold-framed values present at the 0-th clock in the S1$a$, S1$b$ columns and the S2$a$, S2$b$ columns gives values of S1$b$ and S2$b$.

Explanations will be made hereunder by considering the bold-framed data on the IN column as codewords data unless otherwise stated.

Figure 3:
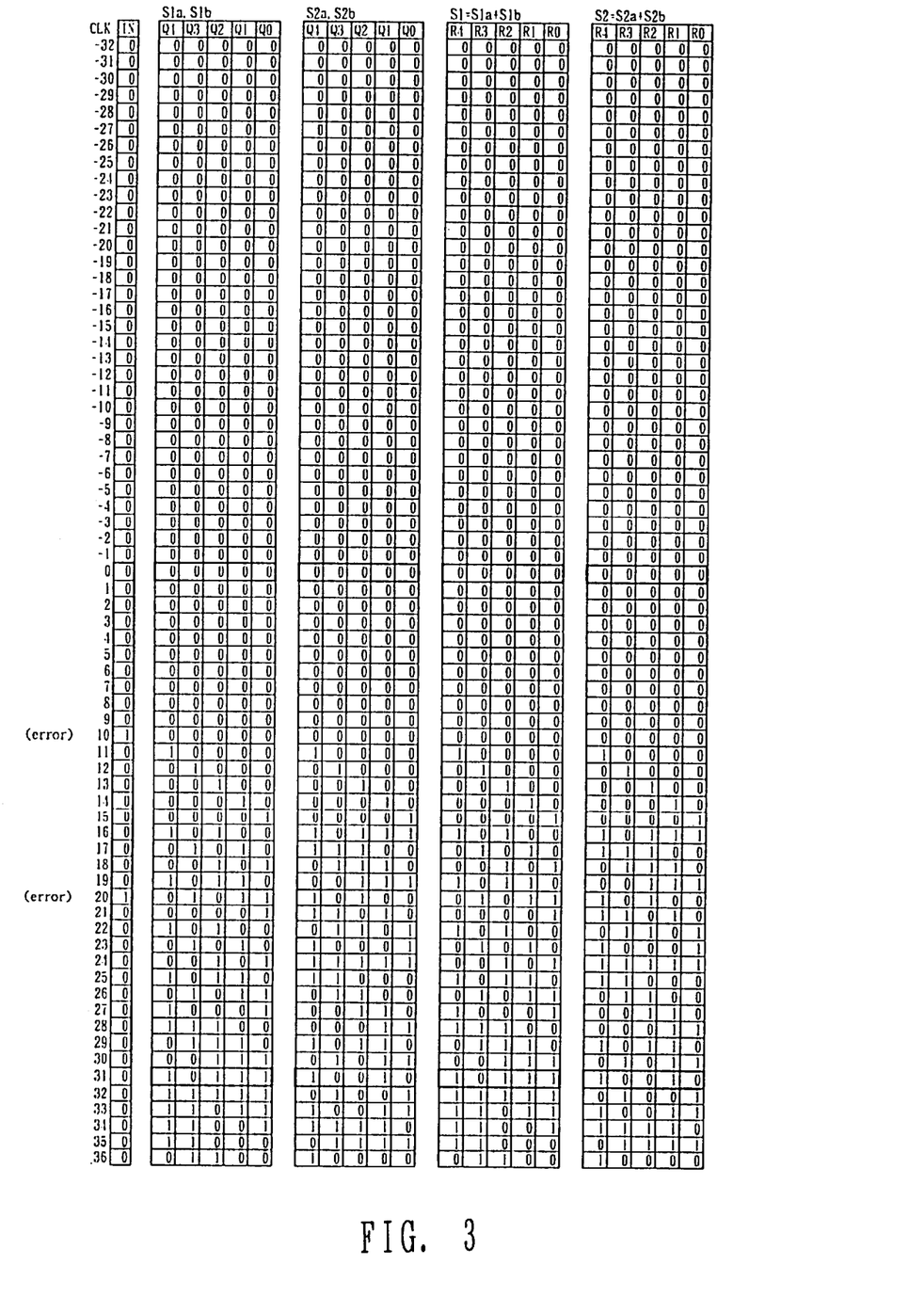
FIG. 3 is an explanatory diagram for explaining operation of the apparatus of FIG. 1.

First, if the values S1$a$, S1$b$, S2$a$, S2$b$ are (0, 0, 0, 0, 0) at a start of code input and syndromes as codewords having "0" for each data input are considered, time syndromes are all 0. Here, FIG. 3 demonstrates data where the data word has errors at a 10-th bit and a 20-th bit. At this time, the syndromes for this data is given as:

$S1$=(1, 0, 1, 1, 1)

$S2$=(1, 0, 0, 1, 0).

Figure 4:
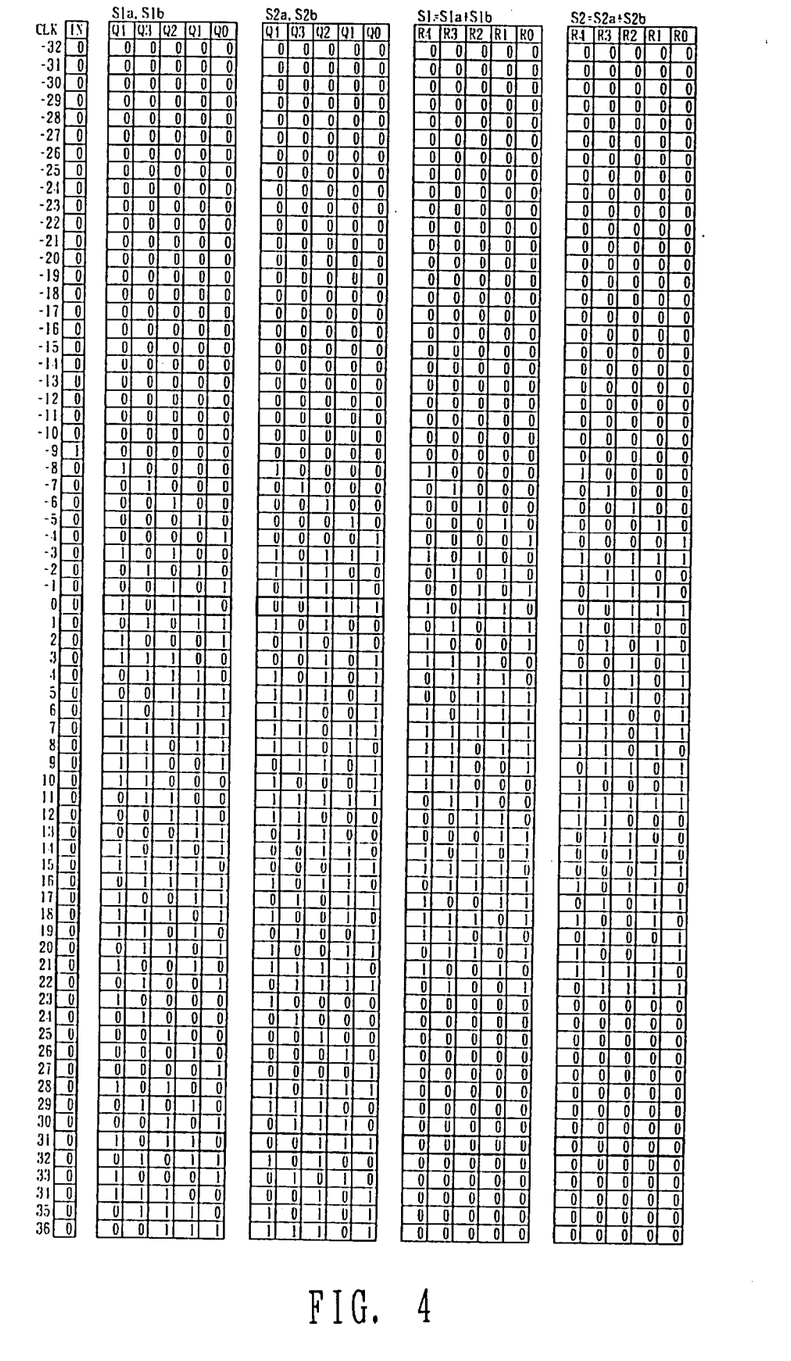
FIG. 4 is an explanatory diagram for explaining operation of the apparatus of FIG. 1.

When the codewords are all 0 and have no error, data enters before code inputting. FIG. 4 shows a case that the first and second syndromes are not 0 at an initial state of code input. In a cyclic code, the first and second syndromes have a same value for the codeword data in this manner. Therefore, the syndromes are 0.

Figure 5:
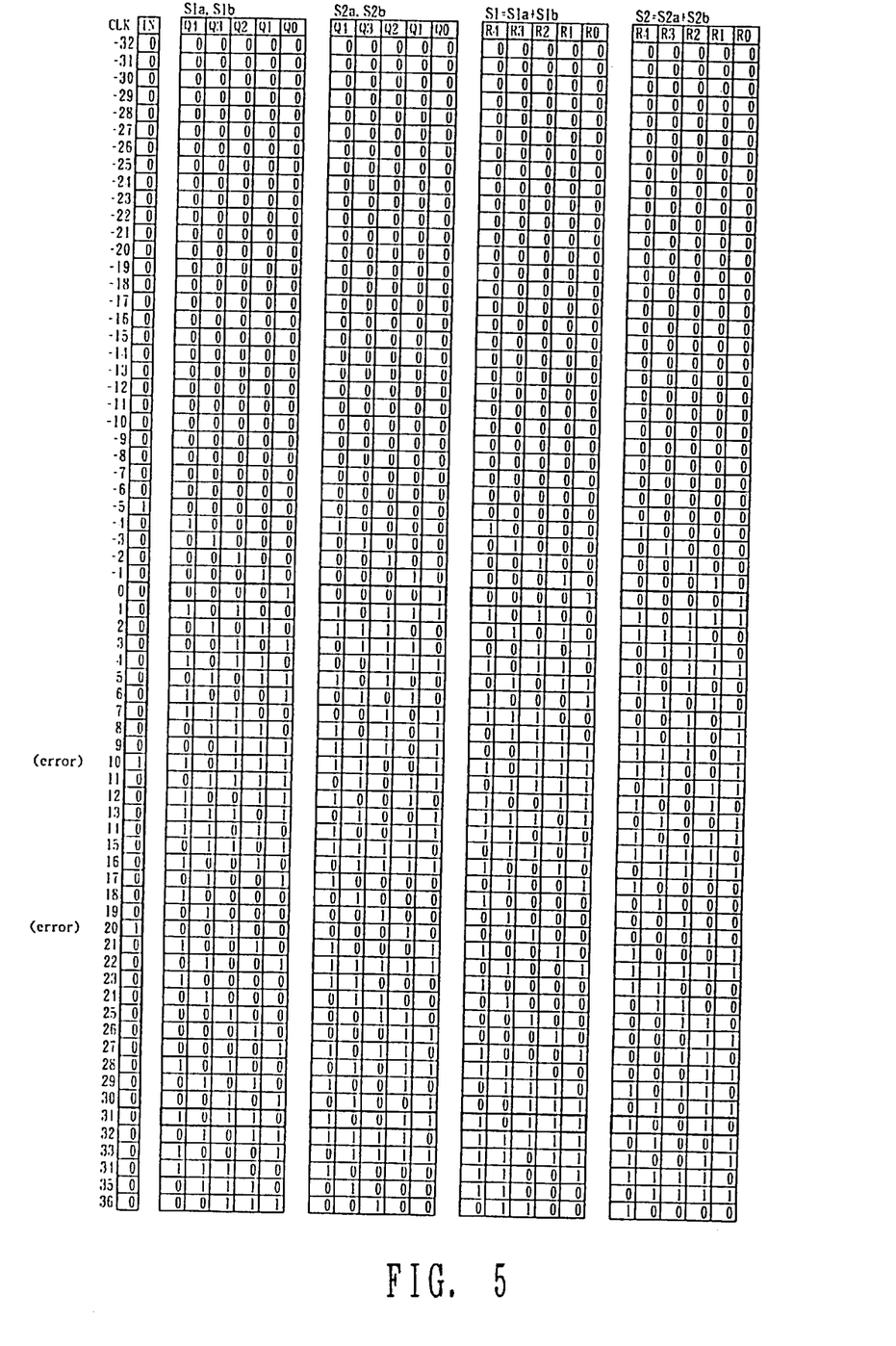
FIG. 5 is an explanatory diagram for explaining operation of the apparatus of FIG. 1.
Figure 6:
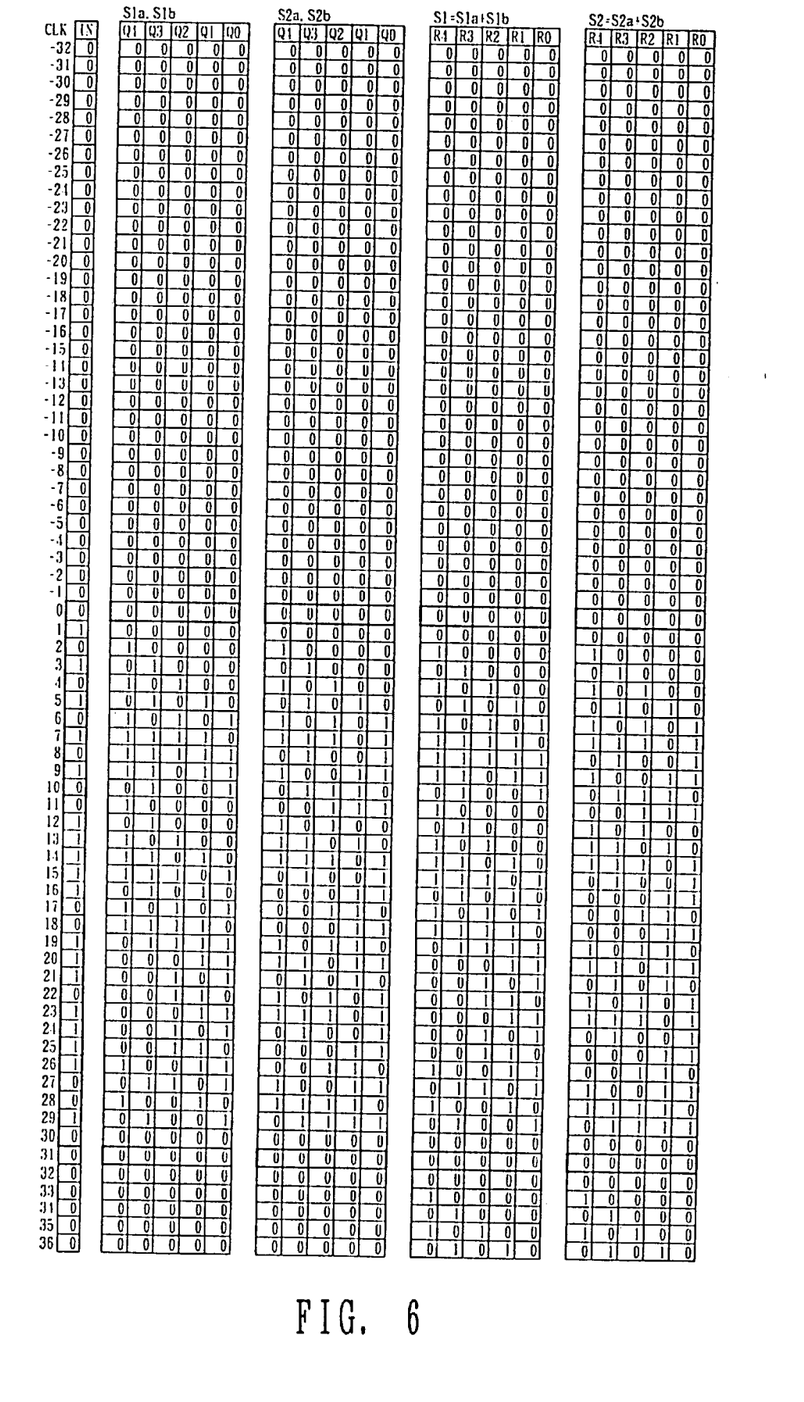
FIG. 6 is an explanatory diagram for explaining operation of the apparatus of FIG. 1.
Figure 7:
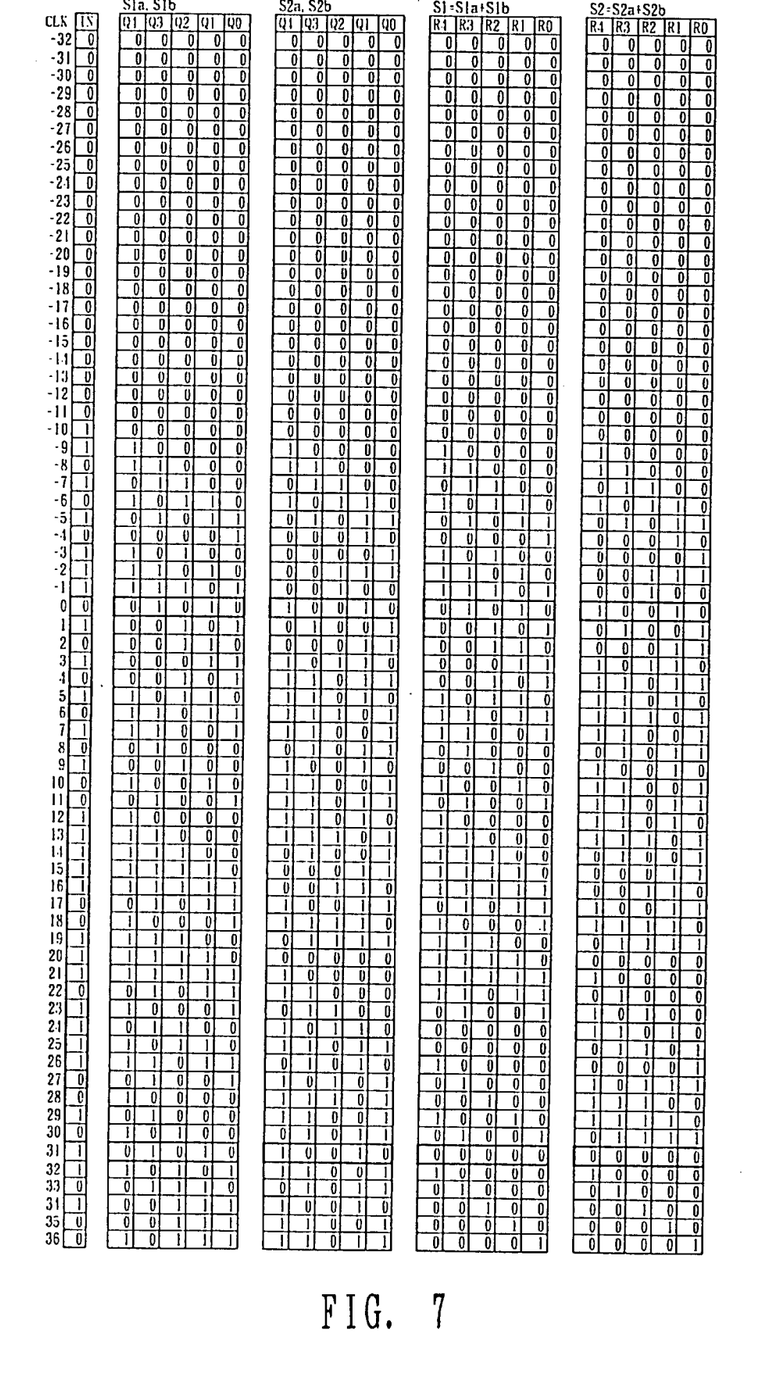
FIG. 7 is an explanatory diagram for explaining operation of the apparatus of FIG. 1.
Figure 8:
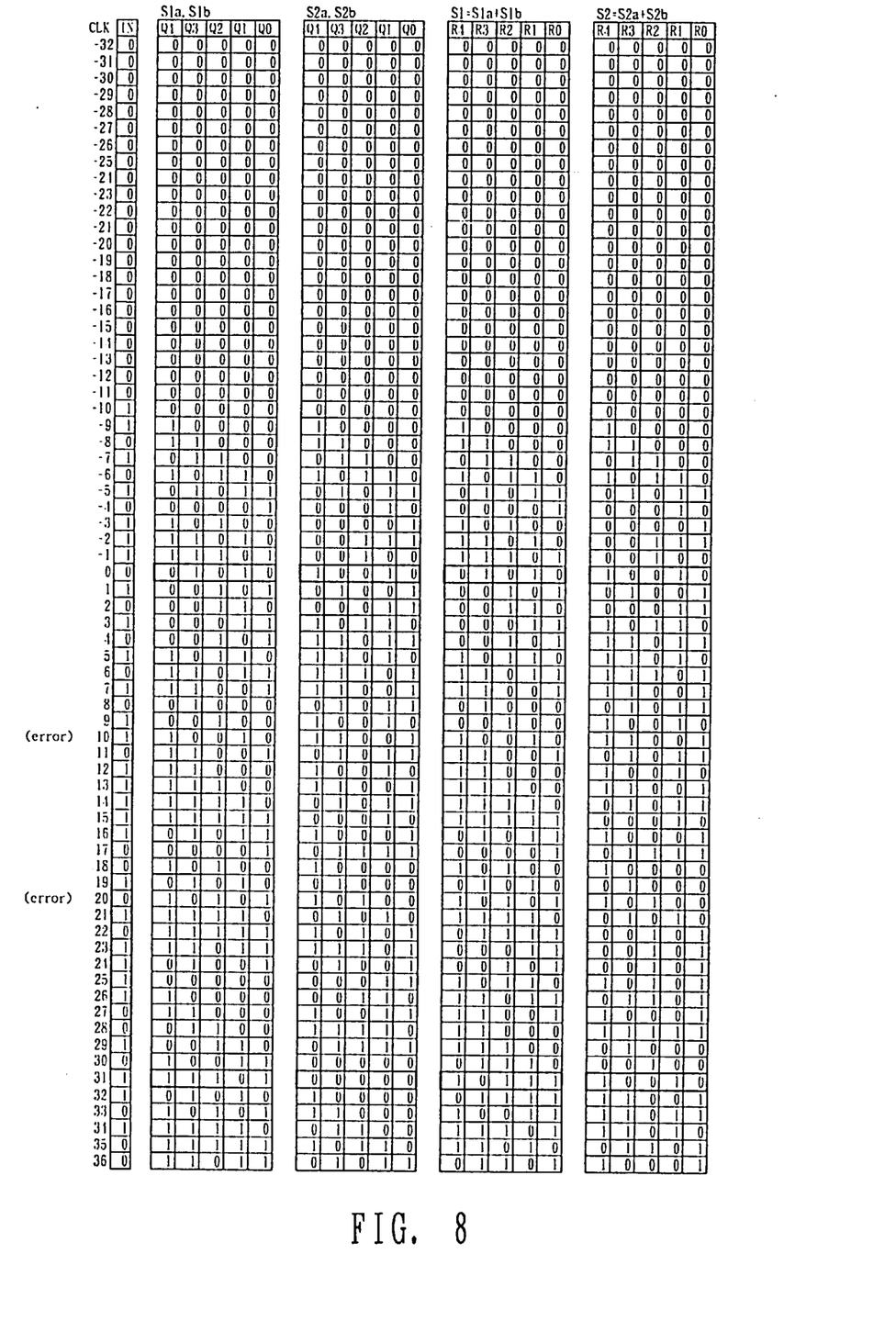
FIG. 8 is an explanatory diagram for explaining operation of the apparatus of FIG. 1.

FIG. 5 shows data that there are errors at a 10-th bit and a 20-th bit similar to the case of FIG. 3. In also this case, the syndromes are further simulated, similarly to FIG. 3, with respect to an appropriate codeword, as shown in FIG. 6, FIG. 7 and FIG. 8. FIG. 6 is a case that the state before inputting the codeword is remained as the initial state. FIG. 7 is a case of before inputting the codeword and the syndromes are not 0. FIG. 8 is a case that the codeword has errors at a 10-th bit and a 20-th bit in the state of FIG. 7.

The syndromes for FIG. 8 are also given as:

$S1$=(1, 0, 1, 1, 1)

$S2$=(1, 0, 0, 1, 0).

It is understood that the syndromes for the error positions are correctly computed.

In FIG. 2 through FIG. 8, the S1 and S2 syndrome values for a time other than that of bold-frame are computed corresponding to the 31-bit input preceded to that time. It is possible to correct at every 1-bit input cycle. Due to this, it is possible to carry out computation of syndromes by a 1-bit unit on input data, even where the start position (delimiting point) is unclear for a codeword. The 31-bit data inputted before can be corrected for errors.

The above example is a mere one example, and the present invention is also applicable to other different cyclic codes for a generator polynominal.

According to the present invention, even where a codeword is unclear of position at which it begins (delimiting point), it is possible to perform a syndrome computation by a 1-bit unit of input to correct for errors on the data with a predetermined number of bits inputted precedent thereto.

That is, the present invention eliminates the necessity of counting, on each time, of the number of times of errors from a circuit such as for collating frame synchronous patterns with codewords. Further, there is no necessity of collating check bits such as a residue, significantly simplifying the apparatus circuit. Even where inputted data (codeword) is unclear of position at which it begins, this data can be computed for a syndrome by a 1-bit unit basis. This allows such a circuit as required for collating frame synchronous, patterns essential for the conventional syndrome computing apparatus to be shared with that of a correcting circuit 10.

What is claimed is:

1. A syndrome computer apparatus, comprising:

a first syndrome computing means for receiving a predetermined number of bits of data (codeword) encoded based on a predetermined generator polynomial, and performing a syndrome computation on the data inputted based on the generator polynomial;

a delay means for outputting the data with a delay by the predetermined number of bits;

a second syndrome computing means for receiving the data delayed by the predetermined number of bits, and performing a syndrome computation on the data inputted based on the generator polynomial; and an operating means for vector-adding modulo 2 a first syndrome outputted by said first syndrome computing means to a second syndrome outputted by said second syndrome computing means;

whereby an output of said operating means is offered as a syndrome based on the generator polynomial.

2. A syndrome computer apparatus according to claim 1, wherein said first and second syndrome computing means are formed by a combination of an exclusive-OR circuit and registers, said delay means being configured by the predetermined number of bits of a shift register, and said operating means is configured by an exclusive-OR circuit.

3. The syndrome computing apparatus of claim 1 wherein said syndrome is correctly computed when the beginning position of the data is not known.

4. A syndrome computing apparatus, comprising:

a plurality of first syndrome computing means for receiving a predetermined number of bits of data encoded based on a generator polynomial, and performing a syndrome computation on the inputted data by using an individually assigned polynomial among a plurality of polynomials constituting the generator polynomial;

a delay means for outputting the data with a delay by the predetermined number of bits;

a plurality of second syndrome computing means for receiving the data delayed by the predetermined number of bits from the delay means, and performing a syndrome computation on the inputted data by using an individually assigned polynomial among a plurality of polynomials constituting the generator polynomial;

a plurality of operating means for vector-adding modulo 2, using the individually assigned polynomial among the plurality of polynomials constituting the generator polynomial, a first syndrome to second syndrome which are respectively outputted by said first syndrome computing means, said second syndrome computing means corresponding to the individually assigned polynomial;

whereby an output of said operating means is offered as a syndrome based on the generator polynominal.

5. A syndrome computing apparatus according to claim 3, wherein said first and second syndrome computing means are formed by a combination of an exclusive-OR circuit and registers, said delay means being configured by a shift register with the predetermined codewords, and said operating means is configured by an exclusive-OR circuit.

6. The syndrome computing apparatus of claim 4 wherein said syndrome is correctly computed when the beginning position of the data is not known.

7. A syndrome computer apparatus, comprising:

a first syndrome computing means for receiving a predetermined number of bits of data (codeword) encoded based on a predetermined generator polynomial, and performing a syndrome computation on the data inputted based on the generator polynomial;

a delay means for outputting the data with a delay by the predetermined number of bits;

a second syndrome computing means for receiving the data delayed by the predetermined number of bits, and performing a syndrome computation on the data inputted based on the generator polynomial; and an operating means for vector-adding modulo 2 a first syndrome outputted by said first syndrome computing means to a second syndrome outputted by said second syndrome computing means;

whereby an output of said operating means is offered as a syndrome based on the generator polynomial; and a correcting circuit which corrects said data inputted which is determined to require correction based upon said syndrome.

8. A method of detecting and correcting errors in a stream of data comprising the steps of:

providing a predetermined number of bits of data to a first syndrome computing circuit;

providing the predetermined number of bits of data delayed by the predetermined number of bits to a second syndrome computing circuit;

providing the predetermined number of bits of data to a third syndrome computing circuit;

providing the predetermined number of bits of data delayed by the predetermined number of bits to a fourth syndrome computing circuit;

computing a first syndrome based upon a first polynomial in the first syndrome computing circuit;

computing a second syndrome based upon said first polynomial in the second syndrome computing circuit;

vector-adding modulo 2 the first syndrome from the first syndrome computing circuit and the second syndrome from the second syndrome computing circuit to obtain a resultant syndrome;

computing a third syndrome based upon a second polynomial in the third syndrome computing circuit;

computing a fourth syndrome based upon said second polynomial in the fourth syndrome computing circuit;

vector-adding modulo 2 the third syndrome from the third syndrome computing circuit and the fourth syndrome from the fourth syndrome computing circuit to obtain a second resultant syndrome;

providing the resultant syndrome and the second resultant syndrome to a correcting circuit for detecting and correcting errors in the stream of data.

* * * * *